(12) United States Patent
Huang et al.

(10) Patent No.: US 8,178,892 B2
(45) Date of Patent: *May 15, 2012

(54) LED CHIP HAVING MICRO-LENS STRUCTURE

(75) Inventors: Tien-Fu Huang, Hsinchu (TW); Shih-Hao Hua, Hsinchu (TW); Kuo-Chang Hu, Hsinchu (TW); Che-wei Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1231 days.

This patent is subject to a terminal disclaimer.

(21) Appl. No.: 11/826,469

(22) Filed: Jul. 16, 2007

(65) Prior Publication Data

US 2008/0157110 A1 Jul. 3, 2008

Related U.S. Application Data

(63) Continuation-in-part of application No. 11/196,254, filed on Aug. 4, 2005, now Pat. No. 7,582,913.

(30) Foreign Application Priority Data

Dec. 29, 2006 (TW) .................................. 095150067

(51) Int. Cl.
*H01L 33/62* (2010.01)
(52) U.S. Cl. .................................. 257/99; 257/E33.067
(58) Field of Classification Search ............ 257/98–100, 257/E33.067–E33.073; 313/509, 313, 512
See application file for complete search history.

(56) References Cited

U.S. PATENT DOCUMENTS

| 5,289,082 | A * | 2/1994 | Komoto ........................ 313/500 |
| 6,987,613 | B2 * | 1/2006 | Pocius et al. .................. 359/565 |
| 7,023,022 | B2 | 4/2006 | Eliashevich et al. |
| 7,513,656 | B2 * | 4/2009 | Park et al. ...................... 362/333 |
| 7,582,913 | B2 * | 9/2009 | Huang et al. ..................... 257/98 |
| 2006/0131599 | A1 * | 6/2006 | Slater et al. ..................... 257/98 |
| 2007/0029563 | A1 * | 2/2007 | Amano et al. ................... 257/98 |
| 2007/0115660 | A1 * | 5/2007 | Lee et al. ...................... 362/240 |
| 2008/0157110 | A1 * | 7/2008 | Huang et al. .................... 257/98 |

FOREIGN PATENT DOCUMENTS

| CN | 1808728 | 7/2006 |
| TW | 533605 | 5/2003 |
| TW | I239660 | 9/2005 |
| TW | 200613767 | 5/2006 |
| TW | 200640047 | 11/2006 |
| WO | WO 2006064996 | * 6/2006 |

* cited by examiner

*Primary Examiner* — Matthew W Such
*Assistant Examiner* — Ali Naraghi
(74) *Attorney, Agent, or Firm* — Rabin & Berdo, P.C.

(57) ABSTRACT

A light-emitting diode (LED) chip having a micro-lens structure includes a light-emitting structure and a light guide lens. The light-emitting structure emits a light from a light-emitting surface upon being applied with a current, and the light guide lens is stacked on the light-emitting surface and used for emitting the light from a light guide surface of the light guide lens. The light guide surface has an annular ridge portion and a scatter region, such that the lights close to the central optical axis of the light-emitting surface (the region having the maximum light-emitting intensity) are deflected in a direction away from the central optical axis, and the lights far away from the central optical axis are deflected towards the central optical axis, so as to obtain a light with a uniform overall optical intensity.

16 Claims, 5 Drawing Sheets

LED CHIP HAVING MICRO-LENS STRUCTURE

CROSS-REFERENCE TO RELATED APPLICATIONS

This non-provisional application claims priority under 35 U.S.C. §119(a) on Patent Application No(s). 095150067 filed in Taiwan, R.O.C. on Dec. 29, 2006, the entire contents of which are hereby incorporated by reference. This application also is a continuation-in-part application of application Ser. No. 11/196,254, filed Aug. 4, 2005 now U.S. Pat. No. 7,582,913 and patented Sep. 1, 2009.

BACKGROUND OF THE INVENTION

1. Field of Invention

The present invention relates to a light-emitting diode (LED) chip having a micro-lens structure, and more particular to an LED chip for providing a uniform plane light source.

2. Related Art

Referring to FIG. 1, the light-emitting chip having a micro-lens structure is a packaged LED chip 100, and it can be found from FIG. 1 that, an N-type semi-conductive layer 102, an active layer 104, and a P-type semi-conductive layer 106 are sequentially stacked on a transparent substrate 110. Then, the LED chip 100 is placed on a substrate 110 (e.g., a lead frame), and after the N-type semi-conductive layer 102 and the P-type semi-conductive layer 106 are respectively guided to two electrode points 116 and 118 of the substrate 110 through leads 112 and 144, a lens 120 is integrally packaged, and thus, an LED chip 100 is finished. The N-type semi-conductive layer 102 and the P-type semi-conductive layer 106 can be exchanged with each other.

When being used, as long as a current is applied on the two electrode points 116 and 118 of the substrate 110, light 122 is produced by the interaction of electrons and holes between the N-type semi-conductive layer 102 and the P-type semi-conductive layer 106 and the active layer 104. The wavelength of the light 122 is relevant to the material of the active layer 104. The produced light 122 is emitted by the lens 120 after being reflected and refracted, and thus, the lens 120 has both functions of guiding the light-emitting angle and protecting the chip.

Although the above structure is capable of producing lights, the direction of the light emitted from the lens is difficult to be controlled due to the internal total reflection and refraction, and a distribution diagram of the light-emitting angle and intensity shown in FIG. 2 is usually produced. As known from FIG. 2 that, the design of the lens 120 makes the light-emitting angle 124 (the angle for emitting the light) between about positive 35° and negative 35° from the central optical axis (0° position), and the closer the distance from the central optical axis is, the higher intensity is. As seen from FIG. 2 that, the region 128 having a higher intensity is about positive/negative 12° from the central optical axis, and thus, the uniformity of the light source is poor, and it is not suitable for the application requiring a plane light source.

FIG. 3 shows a technique of controlling the light emitting direction, which is disclosed in the U.S. Pat. No. 6,987,613. FIG. 3 shows a flip chip LED chip 130 with a Fresnel lens layer 134 added above a top layer 132. Therefore, the light 138 emitted from the active layer 136 performs a total reflection in the LED chip 130 (at the left side, right side, and lower side of the figure), and the light 138 is emitted from the light-emitting surface (the upper side of the figure) through the Fresnel lens layer 134. Since the Fresnel lens layer 134 is characterized in emitting the light in parallel (so-called parallel light), a plane light source is produced.

Although the above U.S. Pat. No. 6,987,613 can achieve the object of a plane light source, due to the complicated process for fabricating the Fresnel lens layer 134, it is difficult to be produced.

Moreover, FIG. 4 shows a technique of fabricating a lens on the surface from which the LED emits the light, which is disclosed in U.S. Pat. No. 7,023,022. It is characterized in disposing a micro-lens array layer 162 on a light-emitting surface of the LED chip 160, such that a total reflection does not occur when the light is emitted from the active layer 164 to the micro-lens array layer 162, but the light passes there through, so as to enhance the overall light-emitting performance. However, as for the direction of the light, it cannot provide a uniform plane light source.

SUMMARY OF THE INVENTION

The present invention provides an LED chip having a micro-lens structure, which has a light transmissive layer stacked on a light-emitting surface of the LED chip to be fabricated as a lens. Through the lens, the light emitted from the LED is made to be uniform in the light-emitting angle, and thus, the region having the maximum optical intensity distribution (close to the region of the optical axis) moves outwardly from the optical axis, so that the overall light-emitting region becomes larger and more uniform (having a higher optical intensity), so as to provide a uniform plane light source.

The LED chip having a micro-lens structure of the present invention includes a light-emitting structure and a transparent substrate having a micro-lens. The light-emitting structure emits a light from a light-emitting surface upon being applied with a current. The light-emitting surface has a central optical axis, and the transparent substrate has a stacking surface and a micro-lens surface. The transparent substrate is stacked on the light-emitting surface through the stacking surface, so as to emit the light from the micro-lens surface. The micro-lens surface has an annular ridge with the central optical axis as the center, so as to form an annular converge region. The micro-lens surface is recessed from the annular ridge portion towards the central optical axis, so as to form a diverge region.

The light-emitting structure includes at least an N-type semi-conductive layer, an active layer, and at least a P-type semi-conductive layer. Once a current is applied on the N-type semi-conductive layer and the P-type semi-conductive layer, the active layer produces the light and emits the light from the light-emitting surface.

Moreover, the annular converge region deflects the light passing through the annular condense region and emits the light towards the central optical axis. The diverge region deflects the light passing through the diverge region and emits the light away from the central optical axis.

Therefore, the region close to the optical axis and having a higher optical intensity may become larger due to the refraction of the diverge region, and the region having a lower optical intensity focuses close to the central optical axis through the deflection of the annular converge region, so as to enhance the overall light-emitting uniformity and meet the requirements of the application of the plane light source.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1:
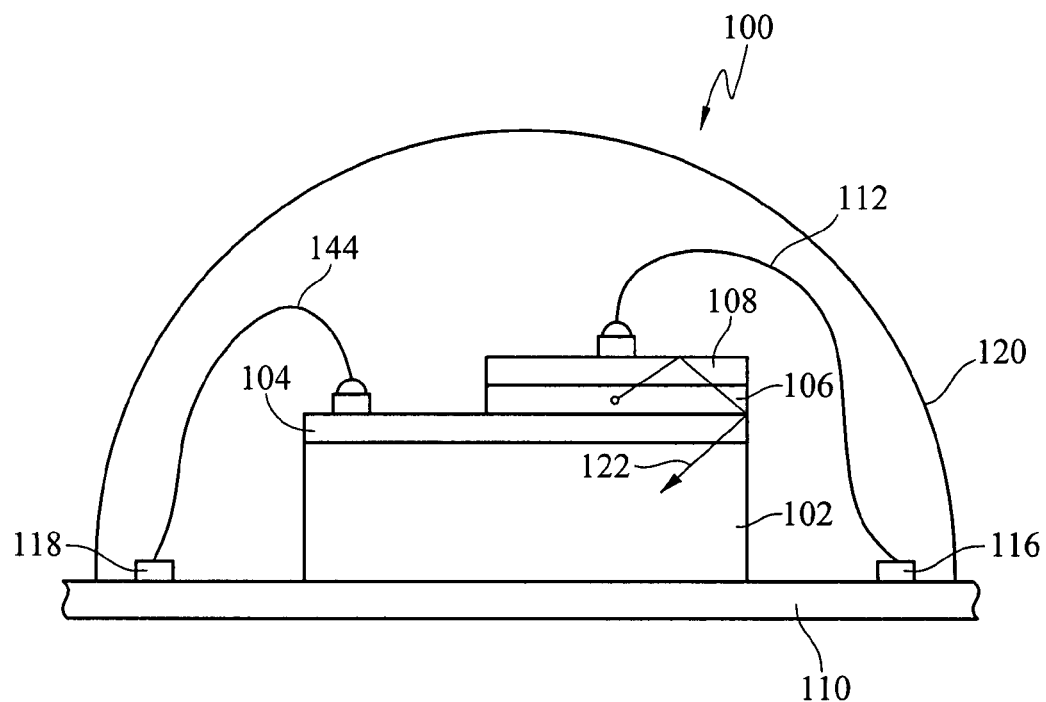
FIG. 1 is a schematic view of a structure of a conventional LED.
Figure 2:
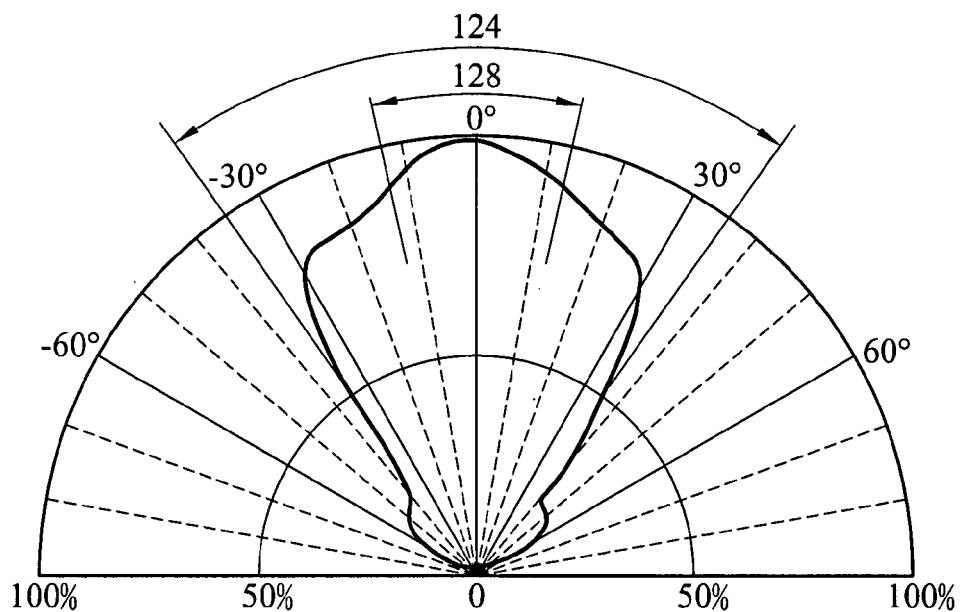
FIG. 2 is a distribution diagram of the light-emitting angle and intensity of the conventional LED.
Figure 3:
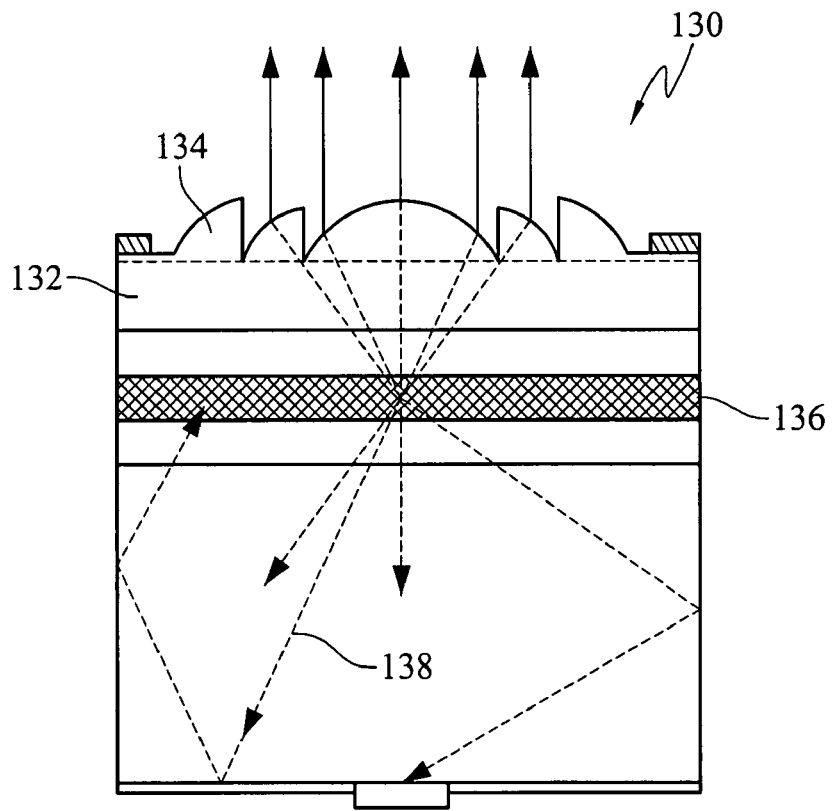
FIG. 3 is a schematic structural view of a conventional LED chip having a micro-lens structure.
Figure 4:
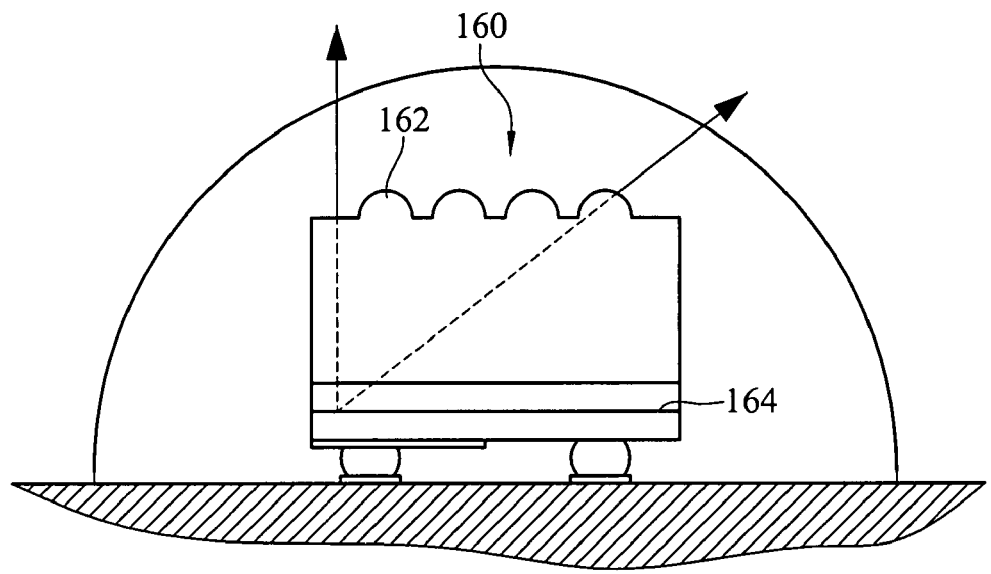
FIG. 4 is a schematic structural view of another conventional LED chip having a micro-lens structure.
Figure 5:
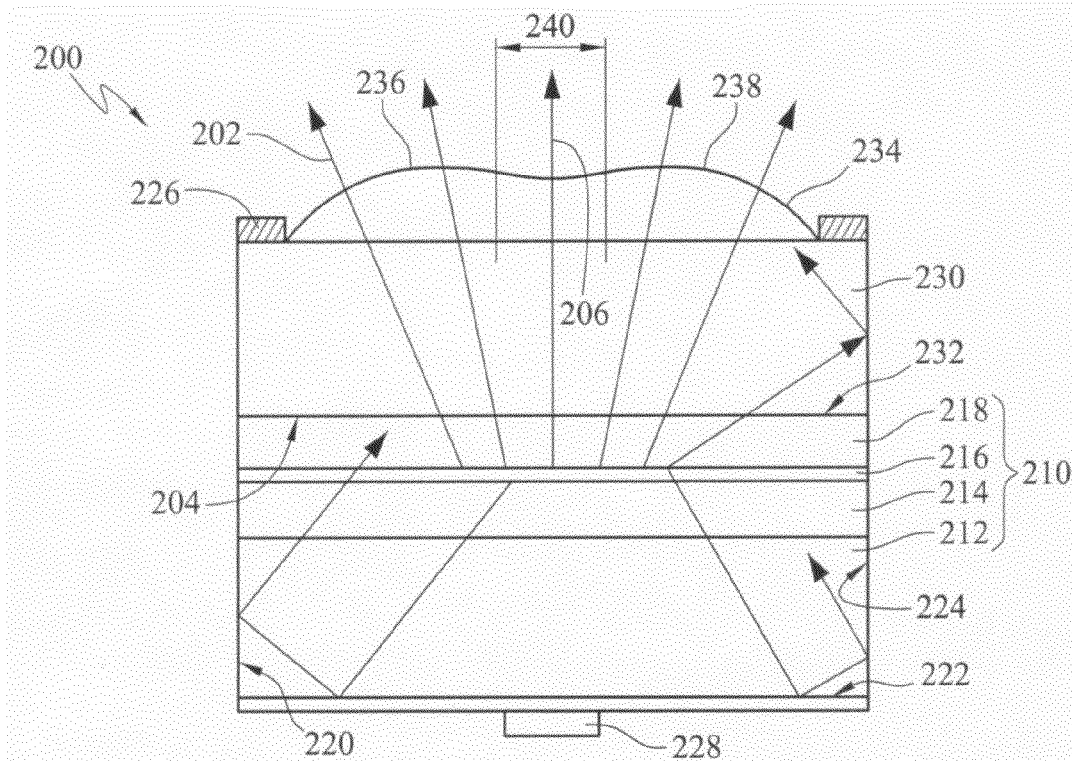
FIG. 5 is a schematic structural view of a first embodiment of the present invention.

FIG. 5 is a schematic structural view of a first embodiment of the present invention. As seen from FIG. 5, the LED chip 200 having a micro-lens structure of the present invention includes a light-emitting structure 210 and a transparent substrate 230. The light-emitting structure 210 emits a light 202 from a light-emitting surface 204 once a current is applied, and the light-emitting surface 204 has a central optical axis 206. The transparent substrate 230 is a micro-lens and has a stacking surface 232 and a light guide surface 234, and the light guide lens 230 is stacked on the light-emitting surface 204 through the stacking surface 232, so as to emit the light from the micro-lens surface 234. The micro-lens 234 has annular ridge portions 236 and 238 with the central optical axis 206 as the center, so as to form an annular convex ridge region. The micro-lens 234 is recessed from the annular ridge portions 236 and 238 towards the central optical axis 206, so as to form a diverge region 240. The transparent substrate 230 is to guide the light emitted from the light-emitting structure 210 and passing through the transparent substrate 230. Therefore, the light guided by the transparent substrate 230 is not limited to visible light, but includes invisible light emitted from the light-emitting structure 210.

The light emitted from the light-emitting structure 210 is a visible light (with a wavelength between 380 nm and 760 nm), an ultraviolet light (with a wavelength smaller than 380 nm), and an infrared light (with a wavelength larger than 760 nm).

The above light-emitting structure 210 is formed by sequentially growing an N-type semi-conductive layer 214, an active layer 216, and at least a P-type semi-conductive layer 218 on a transparent substrate 212 through a semiconductor process. Once a current is applied to the N-type semi-conductive layer 214 and the P-type semi-conductive layer 218 (i.e., a current is applied to two electrodes 226 and 228), the active layer 216 produces a light and emits the light from the light-emitting surface 204. The light-emitting surface 204 herein is an upper surface in the figure, i.e., the light 202 is emitted from the active layer, and scattered in all directions. At this time, if the light contacts other surfaces except the light-emitting surface 204 (i.e., the left side 220, the lower side 222, and the right side 224 in the figure), a total reflection occurs until the light 202 is emitted out of the light-emitting surface 204, i.e., the light-emitting surface 204 is defined as a surface from which the light is penetrated directly.

The central optical axis 206 of the above light-emitting surface 204 is the central position of the whole light-emitting surface 204, if the light-emitting surface 204 is square-shaped or a rectangle-shaped (viewed from the top of the figure), the central optical axis 206 is an intersection point of the diagonal lines. As seen from the structure of the LED 200, the central optical axis 206 is at a position with the densest light rays of the whole LED 200, i.e., the position with the maximum optical intensity.

The above transparent substrate 230 is made of a light-transmissive material for being penetrated by the light 202. The light-transmissive material is, but not limited to, an optical glass (such as an optical glass with a high refraction index), a semiconductor material (such as III-V semiconductor material, II-VI semiconductor material, an organic semiconductor material with a high refraction index), or an organic compound (such as an organic compound with a high refraction index). The transparent substrate 230 is formed through the following procedures. A transparent layer is grown on the P-type semi-conductive layer 218; next, the annular ridge portions 236 and 238 and diverge region 240 are formed through an etching process. From the top view of the annular ridge portions 236 and 238, they are rings with the central optical axis 206 as the center as a convex curved surface, and the scatter region 240 is a round-shaped concave curved surface in the radial inner side of the ring, such that the light 202 passing through the diverge region 240 is deflected and emitted away from the central optical axis 206, i.e., the region with the maximum optical intensity distribution moves outwardly from the central optical axis 206 due to the deflection of the scatter region 240. Therefore, although the brightness of the light spot with the maximum optical intensity is weakened, the overall uniformity is improved.

Figure 6:
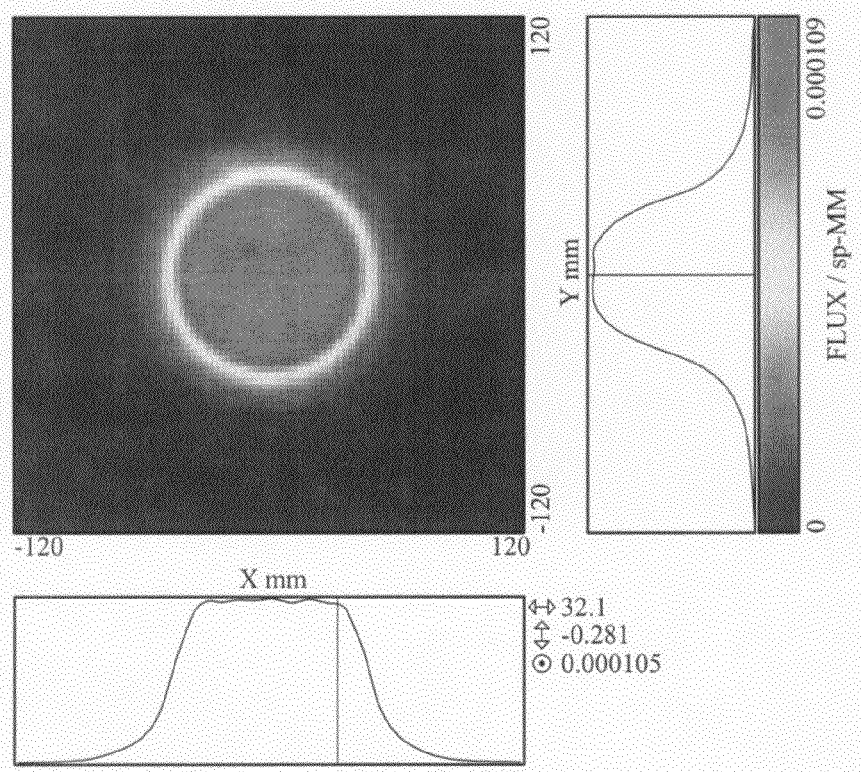
FIG. 6 is a light energy distribution diagram of the first embodiment of the present invention.
Figure 7:
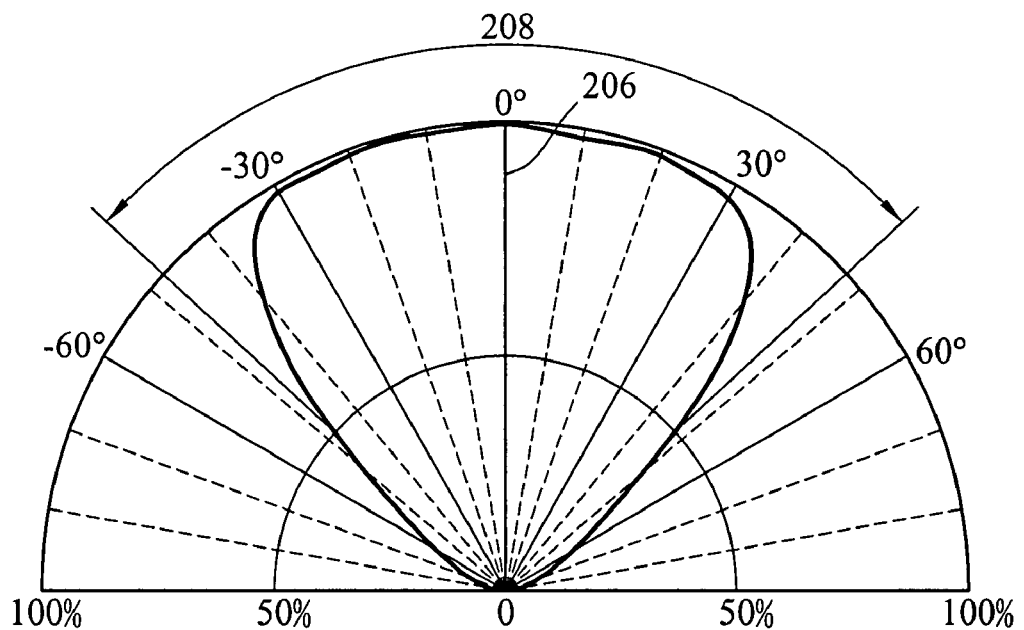
FIG. 7 is a distribution view of the light-emitting angle and intensity of the first embodiment of the present invention.

The annular ridge portions 236 and 238 are disposed in the inner side of the light-emitting angle 208 (referring to FIG. 7) as a convex curved surface. The convex curved surface of the annular ridge portions 236 and 238 and the concave curved surface of the diverge region 240 are a continuous curved surface, such that when the light 202 passes through the annular ridge portions 236 and 238 (annular converge region), it is emitted towards the central optical axis 206 due to the refraction of the annular converge region. Therefore, the weaker light at the inner edge of the light-emitting angle 208 is focused towards the central optical axis 206, and the light 202 close to the central optical axis 206 diverge towards the radial external side due to the diverge region 240, so as to form a uniform plane light source, which is shown in FIGS. 6 and 7. The whole region with the maximum light-emitting intensity (e.g., calculated by less than 50% of the maximum intensity of the light spots) is expanded to positions of positive/negative 45° from the central optical axis 206 due to the transparent substrate 230, so as to make the substantive effects of the present invention be more prominent.

The above stacking surface 232 and the micro-lens surface 234 are two surfaces corresponding to each other, and the stacking surface 232 is stacked on the light-emitting surface 204, such that the light 202 penetrates from the light-emitting surface 204 and then directly emitted through the micro-lens surface 234, and the emitted light 202 is made more uniform through the appropriate allocations of the annular ridge portions 236 and 238 and the diverge region 240 on the micro-lens surface 234.

Figure 8:
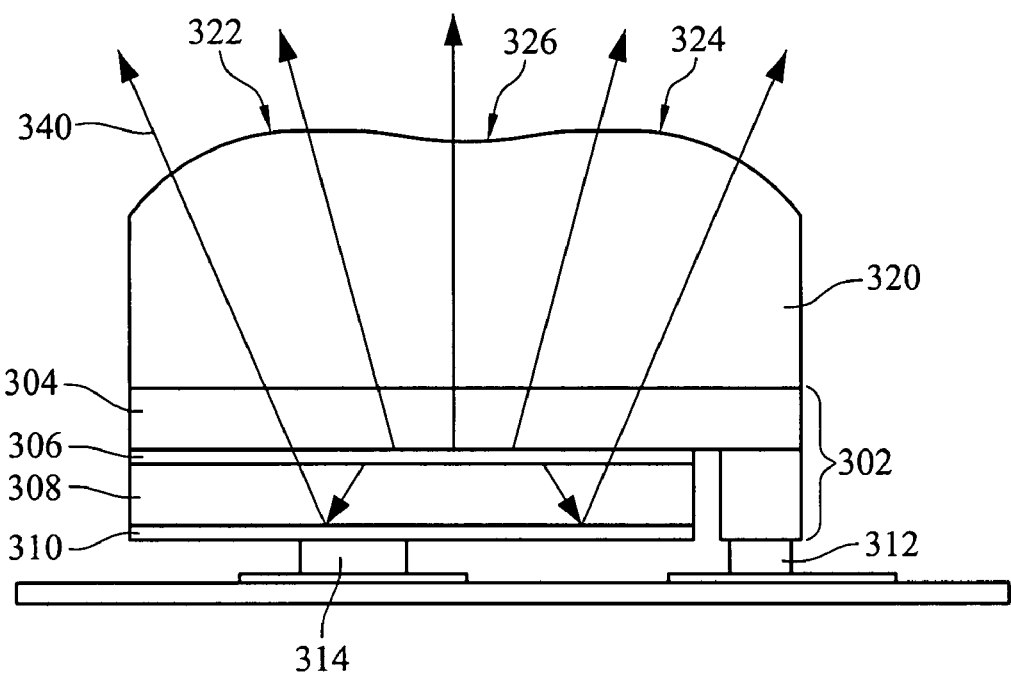
FIG. 8 is a schematic structural view of a second embodiment of the present invention.

Then, FIG. 8 is a view of a second embodiment of the present invention. A transparent substrate 320 is stacked on a light-emitting structure 302, and the light-emitting structure 302 may be a flip chip light-emitting-diode (LED) chip. In addition, the light 340 emitted by the LED chip 302 is made more uniform through the appropriate allocations of the annular ridge portions 322 and 324 and the diverge region 326 on the transparent substrate 320, so as to achieve the same effect as the first embodiment. Only a brief introduction on the light-emitting structure 302 is given herein, an N-type semi-conductive layer 304, an active layer 306, a P-type semi-conductive layer 308, a reflection layer 310 are sequentially stacked on the light guide lens 320 (i.e., a transparent substrate 110) without forming the annular ridge portions 322, 324 and the diverge region 326, and they are electrically connected to the two electrodes 312 and 314 of the N-type semi-conductive layer 304 and the P-type semi-conductive layer 308. When using, as long as a current is applied to the two electrodes 312 and 314, the active layer 306 emits the light 340. The annular ridge portions 322 and 324 and the diverge region 326 (i.e., micro-lens surface) of the transparent substrate 320 of this embodiment can only be formed through an etching process after the above light-emitting structure 302 is completed.

Figure 9:
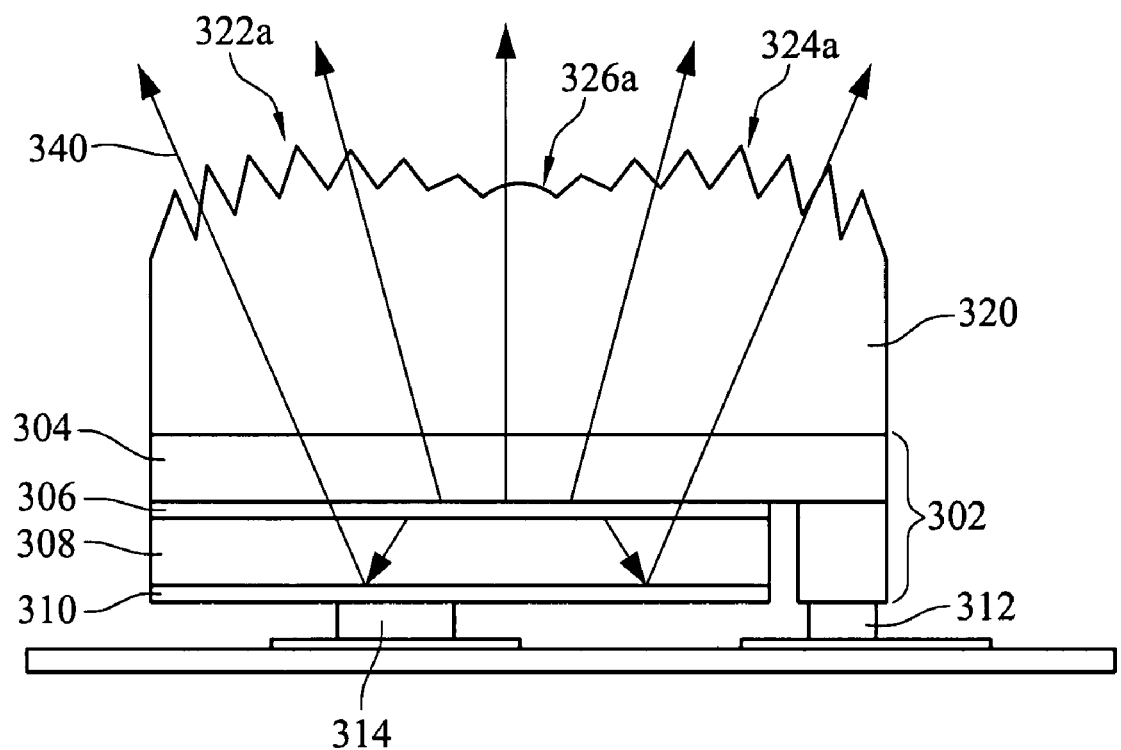
FIG. 9 is a schematic structural view of a third embodiment of the present invention.

Finally, FIG. 9 is a schematic view of a third embodiment of the present invention, which has substantially the same structure as the second embodiment. The only difference between them lies in that, the annular ridge portions 322a and 324a of the third embodiment are designed as a convex curved surface and also as a Fresnel rough surface, and the diverge region 326a is a concave curved surface, which is also a Fresnel rough surface, and thus achieving the objects and effects of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light-emitting diode (LED) chip having a micro-lens structure, comprising:
   a light-emitting structure, for producing and emitting light from a light-emitting surface upon application of current, the light-emitting surface having a central optical axis; and
   a transparent substrate, having a stacking surface and a micro-lens surface, the transparent substrate stacked on the light-emitting surface via the stacking surface to emit the light from the micro-lens surface,
   the micro-lens surface having an annular converge region deflecting and emitting the light passing therethrough towards the central optical axis, the annular converge region including an annular ridge portion centered on the central optical axis, and a diverge region deflecting and emitting the light passing therethrough away from the central optical axis, the diverge region being recessed from the annular ridge portion towards the central optical axis.

2. The LED chip having a micro-lens structure as claimed in claim 1, wherein the light-emitting structure comprises at least an N-type semi-conductive layer, an active layer, and at least a P-type semi-conductive layer, and once a current is applied to the N-type semi-conductive layer and the P-type semi-conductive layer, the active layer produces the light and emits the light from the light-emitting surface.

3. The LED chip having a micro-lens structure as claimed in claim 1, wherein the light is a visible light.

4. The LED chip having a micro-lens structure as claimed in claim 1, wherein the light is an ultraviolet light.

5. The LED chip having a micro-lens structure as claimed in claim 1, wherein the light is an infrared light.

6. The LED chip having a micro-lens structure as claimed in claim 1, wherein the micro-lens surface is made of a light-transmissive material.

7. The LED chip having a micro-lens structure as claimed in claim 6, wherein the light-transmissive material is an optical glass.

8. The LED chip having a micro-lens structure as claimed in claim 6, wherein the light-transmissive material is at least one selected from a group consisting of III-V semiconductor material, II-VI semiconductor material, and organic semiconductor material.

9. The LED chip having a micro-lens structure as claimed in claim 6, wherein the light-transmissive material is an organic compound.

10. The LED chip having a micro-lens structure as claimed in claim 1, wherein the light-emitting structure has a light-emitting angle with the central optical axis as a center, and the annular ridge portion is located at an inner side of the light-emitting angle.

11. The LED chip having a micro-lens structure as claimed in claim 1, wherein the annular ridge portion is a convex curved surface.

12. The LED chip having a micro-lens structure as claimed in claim 11, wherein the convex curved surface is a Fresnel rough surface.

13. The LED chip having a micro-lens structure as claimed in claim 1, wherein the diverge region is a concave curved surface.

14. The LED chip having a micro-lens structure as claimed in claim 13, wherein the concave curved surface is a Fresnel rough surface.

15. The LED chip having a micro-lens structure as claimed in claim 1, wherein the diverge region and the converge region are each continuous curved surfaces.

16. The LED chip having a micro-lens structure as claimed in claim 1, wherein the LED chip is a flip chip light-emitting diode chip.

* * * * *